United States Patent [19]

Nagano et al.

[11] Patent Number: 5,771,443
[45] Date of Patent: Jun. 23, 1998

[54] METHOD AND APPARATUS FOR MEASURING FM FREQUENCY DEVIATION

[75] Inventors: Masao Nagano, Saitama; Hitoshi Takahashi, Gyoda, both of Japan

[73] Assignee: Advantest Corporation, Tokyo, Japan

[21] Appl. No.: 530,717

[22] Filed: Sep. 15, 1995

[30] Foreign Application Priority Data

Sep. 19, 1994 [JP] Japan ................................. 6-223069

[51] Int. Cl.$^6$ ........................................... H04B 17/00
[52] U.S. Cl. .................. 455/115; 455/67.1; 455/226.1; 375/224
[58] Field of Search ................... 455/42–43, 44, 455/67.1, 67.6, 110, 111, 207, 115, 226.1, 226.4; 375/224, 226; 324/76.74, 76.78

[56] References Cited

U.S. PATENT DOCUMENTS

| | | |
|---|---|---|
| 3,914,693 | 10/1975 | Ohlen ................................. 455/115 |
| 4,236,110 | 11/1980 | Shearer et al. ........................ 324/78 Z |
| 4,249,257 | 2/1981 | Campbell ................................. 455/115 |
| 5,001,724 | 3/1991 | Birgenheier et al. .................... 375/226 |

*Primary Examiner*—Reinhard J. Eisenzopf
*Assistant Examiner*—Lee Nguyen
*Attorney, Agent, or Firm*—Staas & Halsey

[57] ABSTRACT

An FM input signal V(t) is A/D converted, then an in-phase component I and a quadrature component Q are obtained. Then, an instantaneous phase $\theta=\tan^{-1}(Q/I)$ of the V(t) is obtained and also an instantaneous frequency of the modulated signal $f_a(t)=(1/2\pi)d\theta/dt$ is obtained. Alternately, $f_a(t)=(IdQ/dt-QdI/dt)/\{2\pi(I^2+Q^2)\}$ is directly obtained from I and Q. A positive peak P+ and a negative peak P− of the obtained $f_a(t)$ is detected to display the average value of these as a frequency deviation.

30 Claims, 7 Drawing Sheets

METHOD AND APPARATUS FOR MEASURING FM FREQUENCY DEVIATION

BACKGROUND OF THE INVENTION

1. Field of the Invention

The present invention relates to a method and an apparatus using the method for measuring frequency deviation of an FM signal outputted from a transmitter, and more particularly, to a method and an apparatus for measuring FM frequency deviation wherein the thermal characteristics and the time passage change characteristics are improved using a digital signal processing technique.

2. Description of the Related Art

An instantaneous carrier is represented by, for example, a formula below, $$V_c = A\sin(2\pi f_s t)$$

where A is an amplitude of a carrier and $f_s$ is an instantaneous frequency of the carrier. If a central frequency of the carrier is $f_c$ and a frequency of a base band modulation signal (e.g., voice signal) is $f_a$, the instantaneous frequency $f_s$ is represented by a formula below, $$f_s = f_c + \Delta f_c \sin(2\pi f_a t)$$

where $\Delta f_c$ indicates a carrier frequency deviation caused by the modulation signal.

Figure 1:
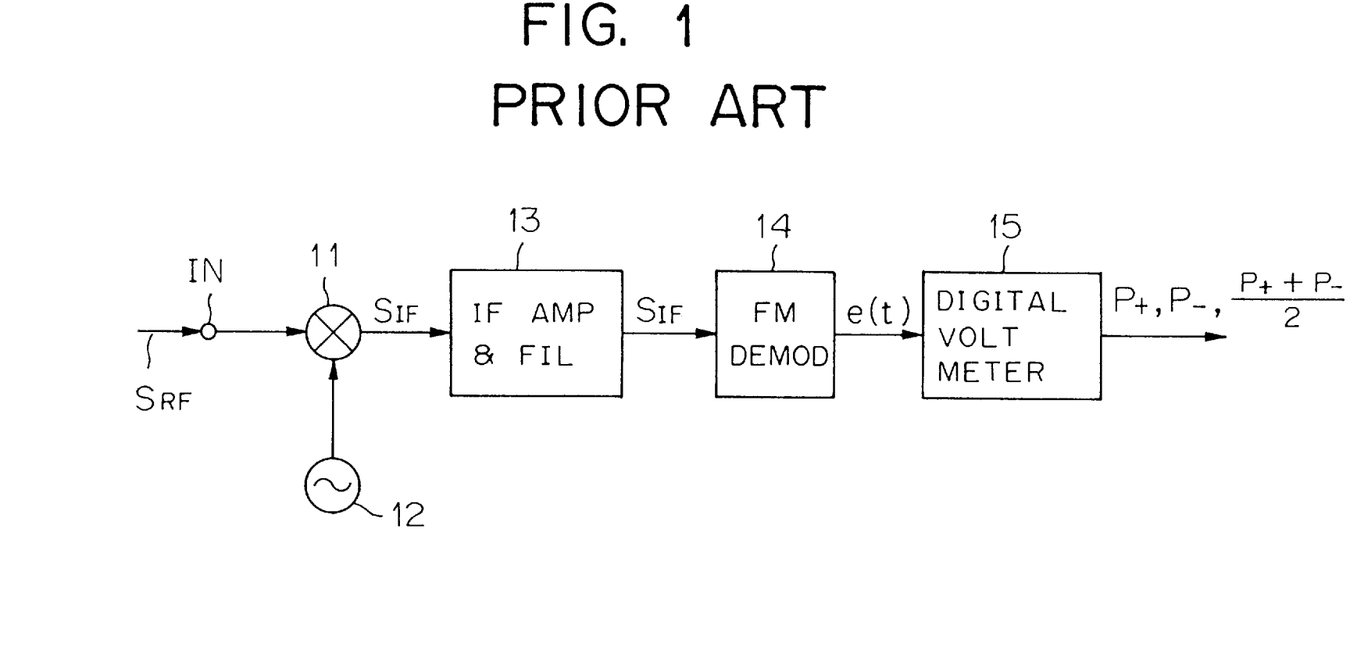
FIG. 1 is a block diagram of a prior art FM frequency deviation measuring apparatus of analog circuit.

A conventional FM frequency deviation measuring apparatus is configured with an analog circuit as shown in FIG. 1. An RF signal $S_{RF}$ inputted to an input terminal IN from an FM transmitter is mixed with a local signal from a local oscillator 12 at a mixer 11 and only a differential component between the both signals, i.e., an intermediate frequency signal $S_{IF}$ is selectively outputted. The intermediate frequency signal $S_{IF}$ is amplified by an IF amplifier/filter part 13 and converted to a voltage (F/V conversion) corresponding to the frequency by an FM demodulator 14 to obtain a demodulated signal e(t). By measuring a positive peak value and a negative peak value of the demodulated signal e (t) for a predetermined time period using a digital volt meter 15, a positive frequency deviation peak value P+ and negative frequency deviation peak value P– corresponding to those signals are obtained. Then, the average value (P++P–)/2 can be obtained as a frequency deviation $\Delta f_c$. In a conventional FM deviation measuring apparatus of an analog circuit, the FM demodulator 15 is constructed with a circuit comprising inductors, capacitors, resistors R, diodes etc. as in a CR differential circuit (HPF) or Foster Seely circuit. Therefore, there is a shortcoming that the F/V conversion characteristics vary in response to the changes of environmental temperature and time passage change of the parts and thus, the measured value of a frequency deviation varies.

SUMMARY OF THE INVENTION

It is an object of the present invention to provide a method and an apparatus for measuring an FM frequency deviation wherein the temperature characteristics and the time passage change characteristics are improved.

According to a first view point of the present invention, an FM input signal V(t) is converted to a digital signal by A/D converter, a calculation for obtaining an in-phase component I and a quadrature component Q of the FM input signal V(t) is performed by quadrature detection part, an instantaneous phase θ of the FM input signal V(t) is calculated from the in-phase component I and the quadrature component Q by phase calculation means, time series data of the instantaneous phase θ is differentiated by differential calculation part to calculate an instantaneous frequency of the modulated signal $f_a(t)$ of the FM input signal V(t) and then a maximum value of a frequency deviation is obtained from the instantaneous frequency of the modulated signal $f_a(t)$.

According to a second view point of the present invention, instead of providing the phase calculation part and differential calculation part in the first view point, an instantaneous frequency of the modulated signal $f_a(t)$ of an FM input signal V(t) is calculated from the in-phase component I and the quadrature component Q and their change rates (dI/dt and dQ/dt).

DETAILED DESCRIPTION OF THE PREFERRED EMBODIMENT

Figure 2:
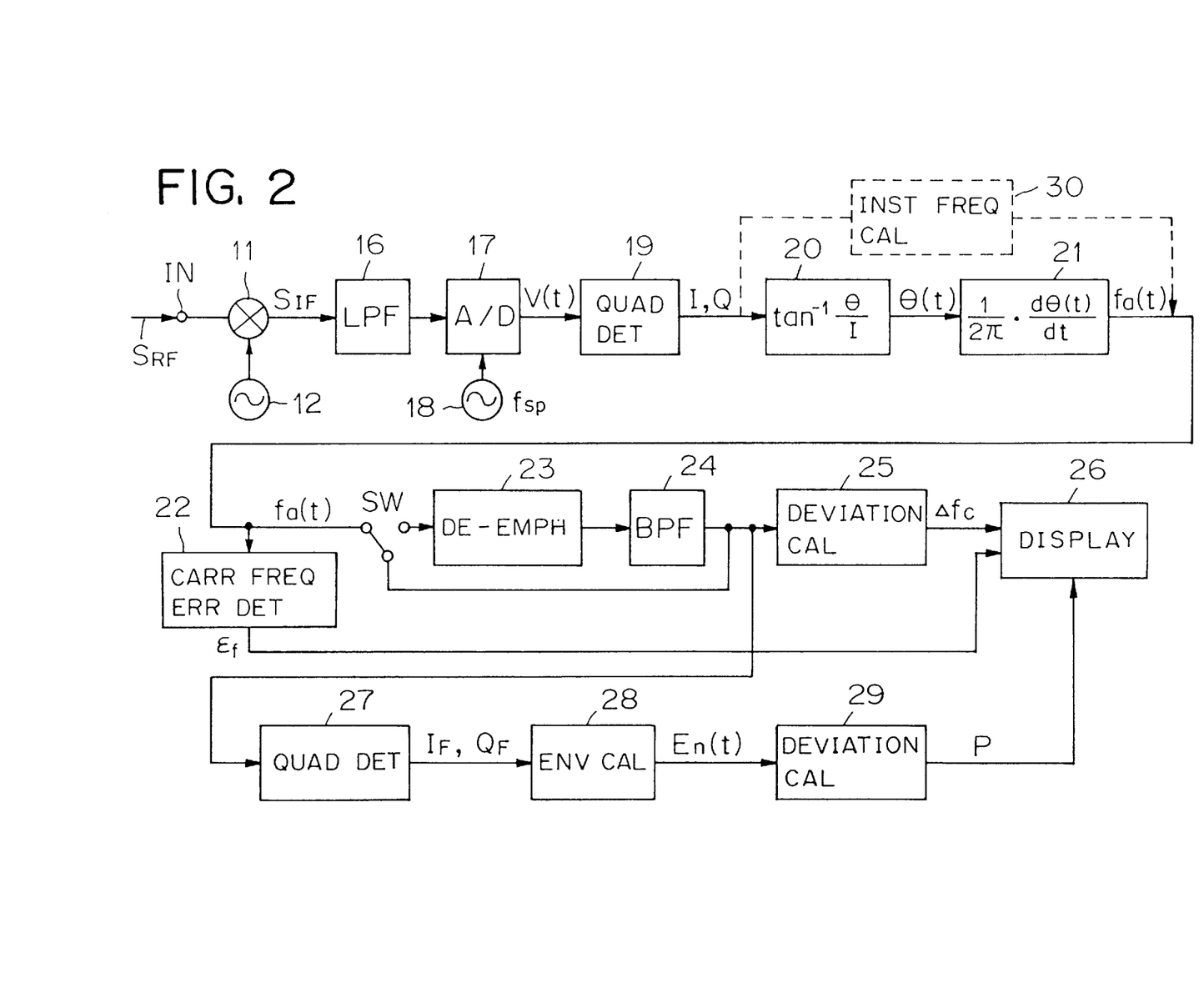
FIG. 2 is a block diagram showing an embodiment of a frequency deviation measuring apparatus of the present invention.

An embodiment of the present invention will be explained referring to FIG. 2. In FIG. 2, similar reference numerals are given to those corresponding parts in FIG. 1. The apparatus of the present invention is for measuring frequency deviation of an FM signal wherein an input terminal IN is coupled, for example, to an antenna terminal of a transmitter through a coaxial cable to input an FM signal $S_{RF}$ to be measured. As explained referring to FIG. 1, an input signal $S_{RF}$ is furnished to a mixer 11 and mixed with a local signal of frequency fL from a local oscillator 12, and then an FM intermediate frequency signal $S_{IF}$ of the difference frequency component is outputted. The FM intermediate frequency signal $S_{IF}$ is band-limited at a low pass filter (LPF) 16 for anti-aliasing to become an FM input signal V(t) and is inputted to an A/D converter 17, and then sampled at the sampling frequency $f_{sp}$ from an oscillator 18 and is converted to adigital signal.

Figure 3A:
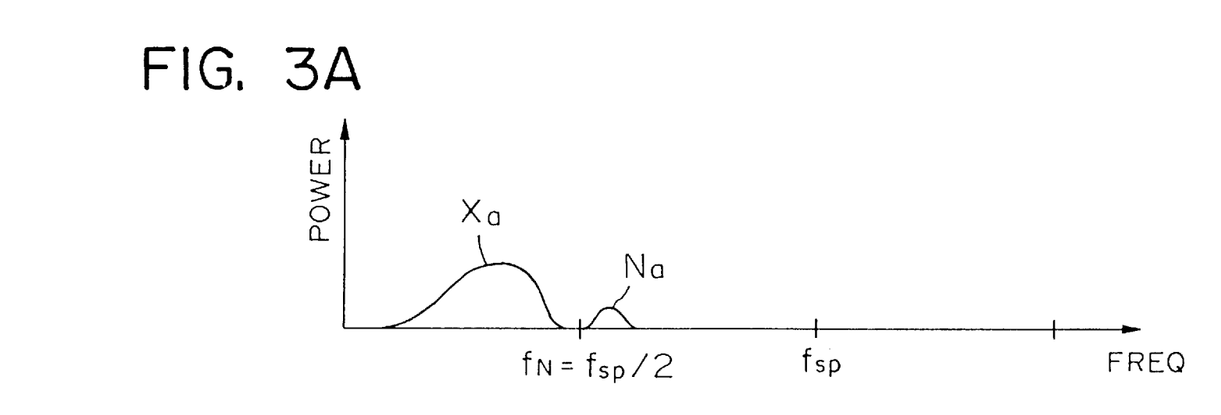
FIG. 3A shows an example of a frequency spectrum of an input signal to an A/D converter 17 without LPF 16 in FIG. 2.
Figure 3B:
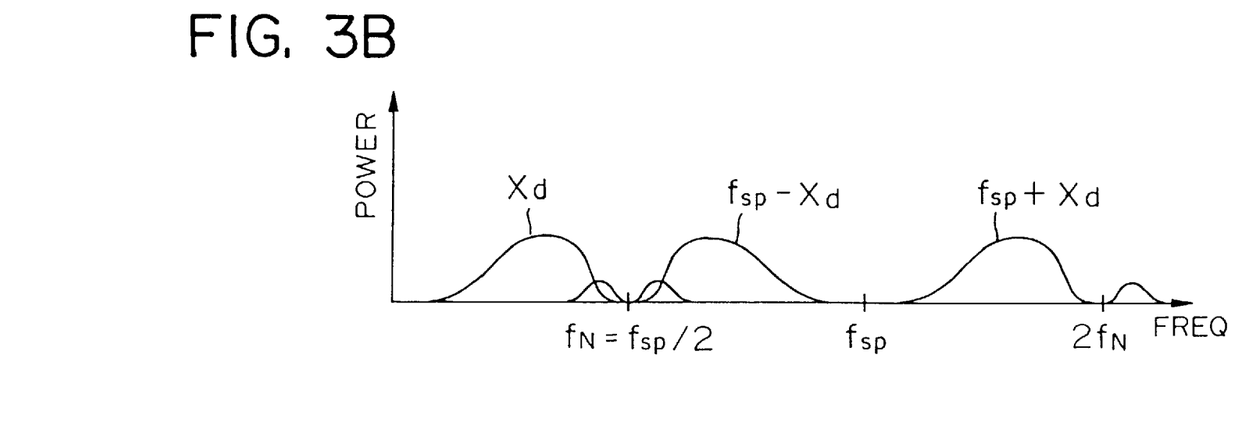
FIG. 3B shows an example of a frequency spectrum of an output signal from the A/D converter 17 without LPF 16 in FIG. 2.

When an FM intermediate frequency signal $S_{IF}$ is A/D converted at the sampling frequency $f_{sp}$, summed components and difference components between the integer multiple of the sampling frequency $f_{sp}$ and a frequency component $X_a$ of the signal $S_{IF}$, $f_s \pm X_a$, $2f_{sp} \pm X_a$, $3f_{sp} \pm X_a$, . . . are generated as in the case where the signal $S_{IF}$ is mixed with the signal of a frequency $f_{sp}$. The sampling frequency $f_{sp}$ is selected in accordance with the sampling theorem so that the sampling frequency $f_{sp}$ is higher than double of the frequency of the FM intermediate frequency signal $S_{IF}$. However, as shown in FIG. 3A, if a noise component Na of a frequency spectrum higher than a Nyquist frequency $f_N = f_{sp}/2$ is contained in the intermediate frequency signal $S_{IF}$, a frequency spectrum of the A/D converted digital signal, i.e. a discrete time signal V(nT) (T is a sampling period, n is sequential integers 0,1,2, . . . , and t=nT hereinafter) cannot be accurately measured because as shown in FIG. 3B, $f_{sp}-X_a$, $2f_{sp}-X_a$, $3f_{sp}-X_a$, . . . are overlapped with $X_a$, $f_{sp}+X_a$, $2f_{sp}+X_a$, . . . , respectively. This overlap is referred to as "aliasing". In order to eliminate this aliasing, a band limitation is made to eliminate frequency components higher than Nyquist frequency $f_N$ at the LPF 16. In this sense, LPF 16 is sometimes referred to as an anti-aliasing LPF.

Figure 4A:
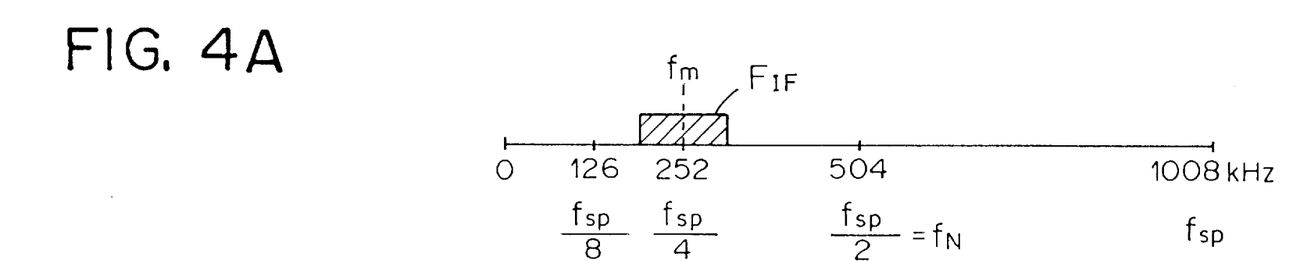
FIG. 4A shows an example of frequency band of an input signal to a quadrature detection part 19 in FIG. 2.

The A/D converted FM input signal V(t) is inputted to the quadrature detection part 19 to calculate its in-phase component I and quadrature component Q by quadrature detection. One of these mutually orthogonal I and Q is a Hilbert transformation of the other and the I and Q are referred to as Hilbert transformation pair. The products $I_b$ and $Q_b$ between the FM input signal V(t) (FIG. 4A) of the intermediate frequency of which central frequency is a predetermined fixed frequency $f_m$ and the reference signals $\cos(2\pi f_m t)$ and $\sin(2\pi f_m t)$ respectively are obtained by the following formulas respectively.

$$I_b = V(t)\cos(2\pi f_m t) \quad (1)$$

$$Q_b = V(t)\sin(2\pi f_m t) \quad (2)$$

Figure 4B:
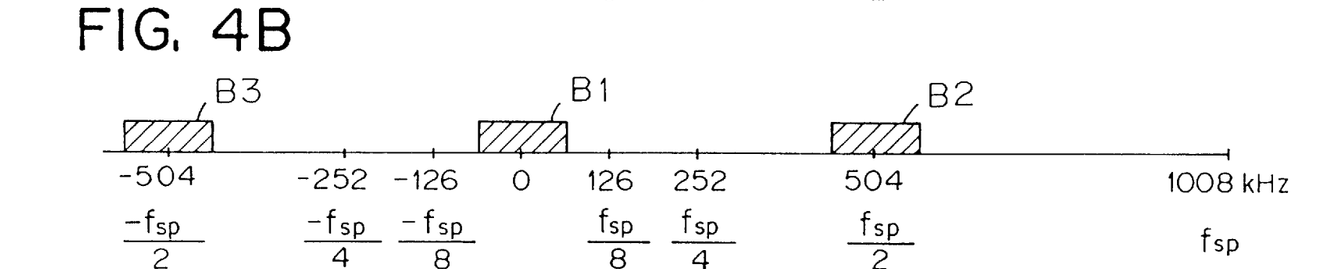
FIG. 4B shows an example for each of the summed frequency band and the difference frequency band between an intermediate frequency band $F_{IF}$ generated by the quadrature detection part 19 in FIG. 2 and a reference frequency $f_m$.
Figure 4C:
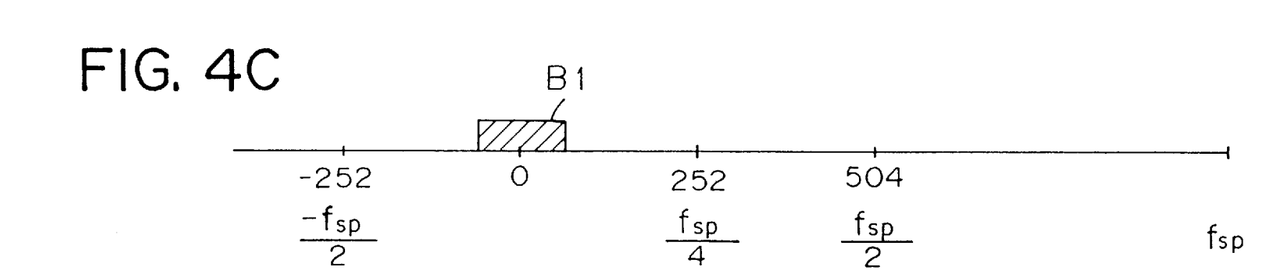
FIG. 4C shows a base band obtained by removing the summed frequency band in the quadrature detection part 19 of FIG. 2.

These signals $I_b$ and $Q_b$ contain, as shown in FIG. 4B, the difference frequency component B1 (i.e., $F_{IF}-f_m$) and summed frequency component B2 (i.e., $F_{IF+fm}$) between the frequency band (intermediate frequency band) $F_{IF}$ and the central frequency $f_m$. Each of the signals $I_b$ and $Q_b$ is filter-processed to takeout only the difference frequency component B1 as shown in FIG. 4C and thus mutually orthogonal in-phase component I and quadrature component Q are obtained. In this case, the central frequency of the difference frequency component is 0 Hz. That is, the central frequency of the Hilbert transformation pair I and Q is 0 Hz. Incidentally, FIG. 4A, 4B and 4C show examples where the IF central frequency $f_m$ is set to 252 kHz and the sampling frequency $f_{sp}$ is set to $f_{sp}=4f_m=1008$ kHz.

The Hilbert transformation pair I and Q is inputted to a phase calculation part 20 and the instantaneous phase θ(t) is calculated by the following formula.

$$\theta(t) = \tan^{-1}(Q/I) \quad (3)$$

The time series data of the instantaneous phase θ(t) are inputted to the differential calculation part 21 and the instantaneous frequency of the modulated signal $f_a(t)$ of the FM input signal V(t) is calculated by the following formula.

$$f_a(t) = \frac{1}{2\pi} \times \frac{d\theta(t)}{dt} \quad (4)$$

Figure 5:
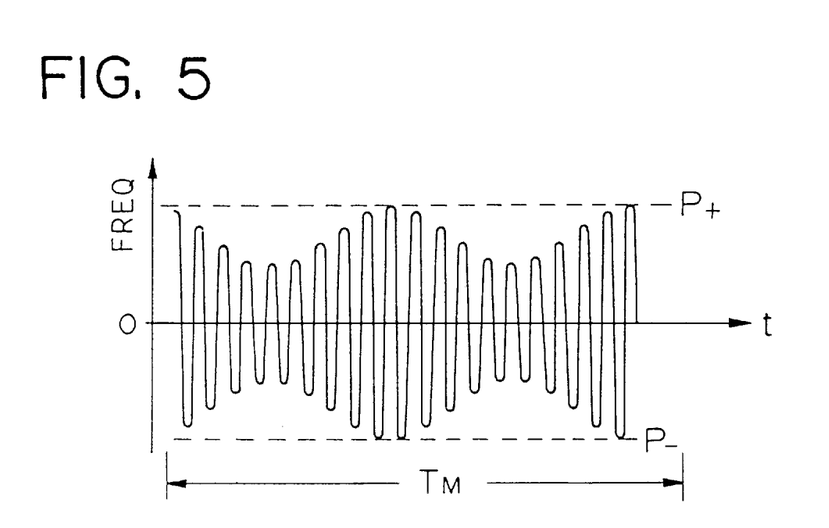
FIG. 5 shows a waveform of an instantaneous frequency of the modulated signal $f_a(t)$.

The frequency $f_a(t)$ is shown in analog wave form in FIG. 5 for example. Thus, the obtained $f_a(t)$ is inputted to the frequency deviation calculation part 25 to obtain a positive peak value P+ and a negative peak value P− (absolute value) during a constant time period $T_M$ of an instantaneous frequency of the modulated signal $f_a(t)$ and the average (P++P−)/2 is obtained as a frequency deviation $\Delta f_c$ and can be displayed on a display part 26.

As shown in FIG. 2 with a dotted line, instead of providing a phase calculation part 20 and a differential calculation part 21, an instantaneous frequency calculation part 30 can be provided to directly calculate an instantaneous frequency of the modulated signal $f_a(t)$ from Hilbert transformation pair I and Q by the following formula.

$$f_a(t) = (IdQ/dt - QdI/dt)/\{2\pi(I^2+Q^2)\} \quad (5)$$

The formula (5) is proven as follows.

$$f_a(t) = (1/2\pi)d\theta/dt \quad (6)$$

$$\theta(t) = \tan^{-1}(Q/I) \quad (7)$$

If Z=Q/I, then formula (7) and (6) are represented as follows respectively.

$$\theta(t) = \tan^{-1} Z \quad (8)$$

$$f_a(t) = (1/2\pi)d\theta/dt = (1/2\pi)(d\theta/dz)(dz/dt) \quad (9)$$

where, $$d\theta/dz = d(\tan^{-1}z)/dz = 1(1+z^2) = I^2/(I^2+Q^2) \quad (10)$$

$$(1/2\pi)dz/dt = (1/2\pi)d(Q/I)/dt = (IdQ/dt - QdI/dt)/(2\pi I^2) \quad (11)$$

If formulas (10) and (11) are substituted for formula (9), $$\begin{aligned} f_a(t) &= \{I^2/(I^2+Q^2)\}(IdQ/dt - QdI/dt)/(2\pi I^2) \\ &= (IdQ/dt - QdI/dt)/\{2\pi(I^2+Q^2)\} \end{aligned}$$

then the formula (5) can be obtained. In the case where the instantaneous frequency of the modulated signal $f_a(t)$ is directly calculated from the formula (5), since the calculation of $\tan^{-1}(Q/I)$ requiring many operation steps is not necessary, there is an advantage that the calculation time can be significantly reduced compared with the case of using formulas (3) and (4).

As described above, the present invention is based on the discovery that the instantaneous frequency of the modulated signal $f_a(t)$ can be obtained by formulas (3), (4) or (5) from the in-phase component I and the quadrature component Q obtained through the steps of A/D converting an FM input signal and quadrature detecting the digital signal using a reference signal of the same frequency as the central frequency $f_m$ of the intermediate frequency. The apparatus according to this principle provides a stable operation and receives less influence from temperature changes since an analog FM demodulator 14 shown in FIG. 1 is not used.

In order to examine characteristics of a transmitter, in the actual measurement, not only frequency deviation but also carrier frequency error is often measured. Therefore, in this embodiment, the apparatus is arranged as described below so that the carrier frequency error $\epsilon_f$ is detected.

The time series data of the instantaneous frequency of the modulated signal $f_a(t)$ from the differential calculation part 21 or the instantaneous frequency calculation part 30 are inputted to a frequency error detection part 22 and then a shift amount of the carrier frequency is detected. In other word, the error detection part 22 integrates the instantaneous frequency of the modulated signal for a time period W which is much longer than, for example approximately 10 times of, the period of a modulation signal (e.g. a pitch period of voice signal) as in the following formula.

$$\Delta F = \int_t^{t+w} f_a(t)dt \qquad (12)$$

This integrated value $\Delta F$ is caused by the frequency error $\epsilon_f$ of the carrier of the input IF signal $S_{IF}$. Since the frequency accuracy of a local oscillator 12 is generally good enough, the carrier frequency error $\epsilon_f$ of the IF signal $S_{IF}$ is equal to the carrier frequency error of the RF signal inputted to the mixer 11. Therefore, $\epsilon_f$ is obtained by the following formula.

$$\epsilon_f = \Delta F/W \qquad (13)$$

This measured value is sent to the display 26 and is displayed along with the frequency deviation $\Delta f_c$.

In this embodiment, a switch SW is provided and the instantaneous frequency of the modulated signal $f_a(t)$ is sent to a de-emphasis part 23 by switching the switch SW when the modulation signal is a voice signal. Then, the peak value can also be obtained after removing a pre-emphasis given to the signal $f_a(t)$. In other word, when a carrier is frequency modulated with a voice signal for transmission, the original base band signal before the conversion to an RF signal $S_{RF}$ or IF signal $S_{IF}$ is pre-emphasized to be a signal of which higher components are emphasized. The RF signal of which carrier is FM modulated by this base band signal is supplied to the terminal IN. Therefore, by F/V converting, like an FM receiver, the instantaneous frequency of the modulated signal $f_a(t)$ obtained from the differential calculation part 21 to obtain demodulated original base band signal and by passing it through a de-emphasis circuit having opposite gain-frequency characteristics from the pre-emphasis circuit, the flat gain-frequency characteristics of the base band signal can be restored. In the apparatus of this embodiment, the instantaneous frequency of the modulated signal $f_a(t)$ is inputted to the de-emphasis part 23 via the switch SW and is weighted in accordance with the de-emphasis characteristics to remove an influence of the pre-emphasis.

The output of the de-emphasis part is inputted to a bandpass filter (BPF) 24 configured as a digital filter to remove noise components and to limit the higher side frequency to, for example, 3 kHz, 15 kHz etc. The output $f_a(t)$ of the BPF 24 is inputted to a frequency deviation calculation part 25 to calculate the positive peak value P+ and the negative peak value P−(absolute value). The average of the positive and negative peak values (P++P−)/2 is outputted as a frequency deviation. The data associated with the frequency deviation is inputted to the display 26 and is displayed on the screen.

Incidentally, the frequency error detection part 22, the de-emphasis part 23 and the BPF 24 may be omitted dependent on the necessity.

The waveform of $f_a(t)$ in FIG. 5 corresponds to a voltage waveform of the modulation signal if the frequency of vertical axis is substituted by voltage. If the modulation signal is a voice signal, the deviation of $f_a(t)$ varies. Therefore, as shown in FIG. 5, the peak envelope of the instantaneous frequency varies. Since the digital value of the instantaneous frequency of the modulated signal $f_a(t)$ obtained by the formulas (4) or (5) is a data for each sampling period $T=1/f_{sp}$, if the sampling frequency $f_{sp}$ is high enough compared with the $f_a(t)$ variation, each peak of the frequency deviations can be detected. However, if the sampling period T is longer, the sampling timing may significantly shift from the peak position as shown by dots on the waveform $f_a(t)$ in FIG. 6A and thus the accurate frequency deviation cannot be measured. In such a case, if the waveform of $f_a(t)$ is presumed as an oscillating voltage wave form, and if $f_a(t)$ is quadrature-detected and a square root of the sum of squares of the in-phase component $I_F$ and the quadrature component $Q_F$ is obtained, then the peak envelope of the instantaneous frequency of the modulated signal $f_a(t)$ can be obtained. Thus, even if the sampling timing does not match the frequency peak position, a big error does not occur. That is, the peak value can be obtained as below assuming the amplitude of the instantaneous frequency of the modulated signal $f_a(t)$ is constant.

The instantaneous frequency of the modulated signal $f_a(t)$ from the differential calculation part 21 or the instantaneous frequency calculation part 30 is quadrature detected in the second quadrature detection part 27 to calculate the in-phase component $I_F$ and the quadrature component $Q_F$ as a Hilbert transformation pair. First, product $I_0$ of the instantaneous frequency of the modulated signal $f_a(t)$ and the reference signal $\cos(2\pi f_0 t)$ and product $Q_0$ of the $f_a(t)$ and the reference signal $\sin(2\pi f_0 t)$ are obtained.

$$I_0 = f_a(t)\cos(2\pi f_0 t) \qquad (14)$$

$$Q_0 = f_a(t)\sin(2\pi f_0 t) \qquad (15)$$

Assuming that the $f_a(t)$ is a signal of a single frequency, the signal would be quadrature detected with two mutually orthogonal reference signals $\cos(2\pi f_0 t)$ and $\sin(2\pi f_0 t)$ to obtain the in-phase component $I_F$ and the quadrature component $Q_F$ and then $(I_F^2 + Q_F^2)^{1/2}$ would be obtained. Since this is same as the amplitude (envelope) of the $f_a(t)$, the maximum value of $f_a(t)$ can accurately be obtained independently of the sampling timing. Therefore, if $f_a(t)$ is expanded into Fourier series to represent the formula below, $$f_a(t) = \sum_{i=0}^{k} x_i \cos(2\pi i f_a t) \qquad (16)$$

the same as the above can apply for a component $x_i \cos(2\pi i f_a t)$ of each frequency $i \times f_a$. In this case, k is a value determined by the upper limit of the pass band given to the signal V(t). For example, i-th frequency component is represented by $f_{ai}(t)$ and the following formulas are assumed.

$$f_{ai}(t) =_i \cos(2\pi i f_a t) = x_i \cos \alpha_i \qquad (17)$$

$$2\pi f_0 t = \beta \qquad (18)$$

In order to obtain the Hilbert transformation pair $I_{Fi}$ and $Q_{Fi}$ for i-th term component $f_{ai}(t)$ in the formula (17), the product of $f_{ai}(t)$ and the reference signal $\cos(2\pi f_0 t)$ and the product of $f_{ai}(t)$ and the reference signal $\sin(2\pi f_0 t)$ are represented as follows.

$$I_{oi} = f_{ai}(t)\cos(2\pi f_0 t) = x_i \cos\alpha_i \cos\beta = x_i\{\cos(\alpha_i + \beta) + \cos(\alpha_i - \beta)\} \qquad (19)$$

$$Q_{oi} = f_{ai}(t)\sin(2\pi f_0 t) = x_i \cos\alpha_i \sin\beta = x_i\{\sin(\alpha_i + \beta) - \sin(\alpha_i - \beta)\} \qquad (20)$$

The difference components $x_i \cos(\alpha_i - \beta)$ and $x_i \sin(\alpha_i - \beta)$ in formulas (19) and (20) can be obtained as the Hilbert transform pair $I_{Fi}$ and $Q_{Fi}$. By the way, the sum of the in-phase components $I_{F1} + I_{F2} \ldots + I_{Fk}$ and the sum of the quadrature components $Q_{F1}+Q_{F2}\ldots+Q_{Fk}$ of the respective frequency components of the signal $f_a(t)$ are equal to the in-phase component $I_F$ and the quadrature component $Q_F$, respectively. Thus, following formulas are in effect.

$$I_0 = \sum_{i=0}^{k} I_{0i} \quad (21)$$

$$Q_0 = \sum_{i=0}^{k} Q_{0i} \quad (22)$$

Figure 6A:
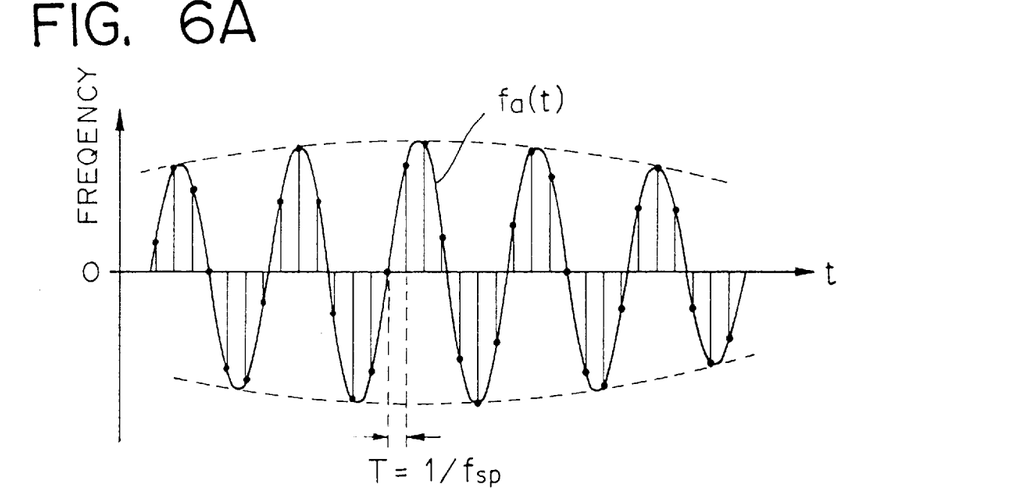
FIG. 6A shows a relationship between $f_a(t)$ and sampling timings in detail.
Figure 6B:
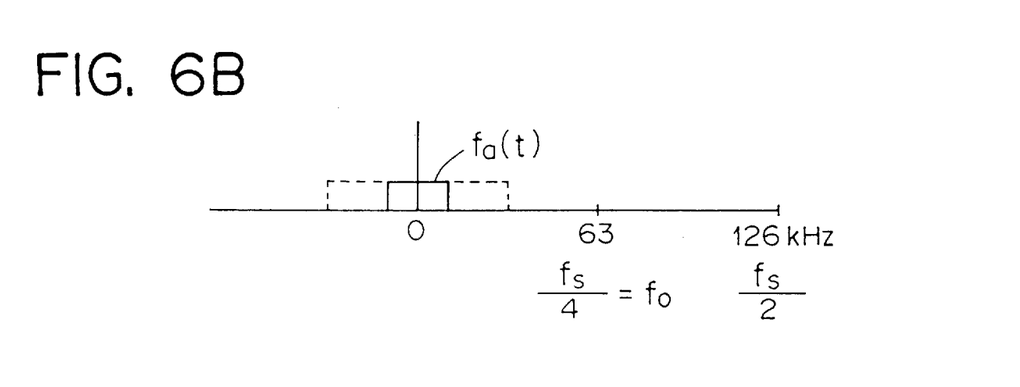
FIG. 6B shows an example of a frequency band of $f_a(t)$.
Figure 6C:
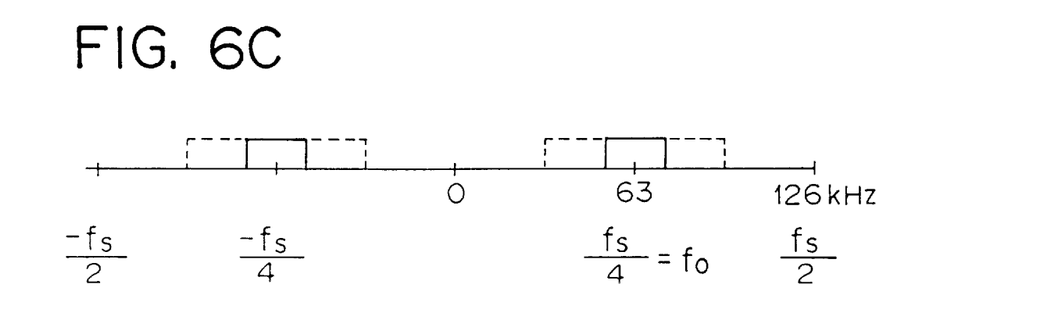
FIG. 6C shows an example for each of the summed frequency band and the difference frequency band between $f_a(t)$ generated in the quadrature detection part 27 of FIG. 2 and a reference frequency $f_0$.
Figure 7:
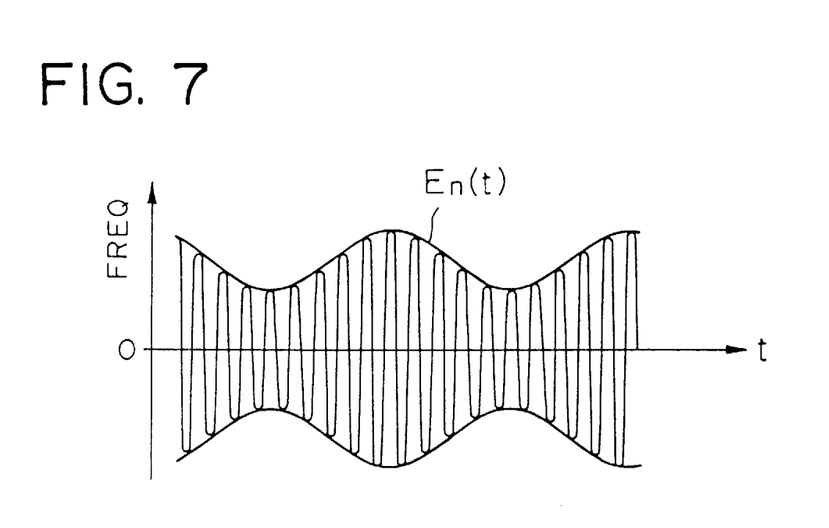
FIG. 7 shows an output wave form of an envelope calculation part 18 in FIG. 2.

This means that formulas (21) and (22) are the same as those formulas (14) and (15) respectively and thus, the envelope of $f_a(t)$ can be obtained by obtaining $I_0$ and $Q_0$ from formulas (14) and (15) and by filtering these to obtain the Hilbert transformation pair $I_F$ and $Q_F$, and then by calculating $(I_F^2+Q_F^2)^{1/2}$. However, as shown in FIG. 6A, since $f_a(t)$ deviates to positive and negative directions from 0 Hz, the frequency band is centralized to frequency 0 Hz as shown in FIG. 6B for example. As described above, if $f_a(t)$ is further quadrature detected by the sine wave of the frequency $f_0$, the summed components and the difference components between the frequencies $\alpha_i$ and $\beta$ are generated as in formulas (19) and (20). These are the spectra to which $f_a(t)$ is shifted in positive and negative directions by $f_0$ as shown in FIG. 6C. Therefore, regarding the calculation results $I_0$ and $Q_0$ of formulas (14) and (15), the quadrature detection part 27 performs filtering process of the $I_0$ and $Q_0$ so that only either one of the summed component or the difference component is further taken out and outputs them as the Hilbert transformation pair. The envelope calculation part 28 calculates formula (23) to obtain $$En(t)=(I_F^2+Q_F^2)^{1/2} \quad (23)$$

as a sample value $En(nT)$ for each sampling timing (period $T=1/f_{sp}$) of the envelope of the instantaneous frequency of the modulated signal $f_a(t)$. Incidentally, an arbitrary value can be selected for the reference frequency $f_0$ but $f_0=f_{sp}/4$ is desirable. Because, the phase $2\pi f_0 t$ of cosine and sine in formulas (14) and (15) increases by 90 degrees for each sampling period $T=1/f_{sp}$, and each of cosine and sine takes either one of the values 0, 1 and $-1$ and thus, the calculations of formulas (14) and (15) are simplified. FIG. 6C shows the case of $f_0=f_{sp}/4=63$ kHz.

The sample values of the envelope $En(nT)$ are inputted to the second deviation calculation part 29 to detect the maximum value P during each predetermined period $T_M$ which is longer enough than the envelope value $En(nT)$ variations. When more accurate measurement is necessary, the maximum envelope value between sampling timings of time interval T is obtained as the maximum value of the frequency deviation by an interpolation or a functional approximation from the detected maximum value P and the adjacent sample values and is given to the display 26. Therefore, in this case, the deviation calculation part 25 is not necessary.

In the actual measurement, a carrier is frequency modulated by a constant frequency and constant amplitude signalin the range of 1–10 kHz for example, instead of a voice signal. The frequency deviation of this modulated carrier is often measured. In this case, since the deviation width of the instantaneous frequency $f_a(t)$ to positive and negative directions is constant and the values are P+ and P−, the average value of the envelope sample values $En(nT)$ obtained by formula (24) within the predetermined time period (could be shorter than $T_M$) may be used as the frequency deviation.

Incidentally, the second quadrature detection part 27, the envelope calculation part 28 and the peak deviation calculation part 29 may be omitted in a simple apparatus.

In the above description, it is desirable to set the sampling frequency $f_{sp}$ to 4 times of the central frequency $f_m$ of the FM input signal V(t) as in the examples shown in FIGS. 4A, 4B and 4C. The reason is described below.

Figure 8:
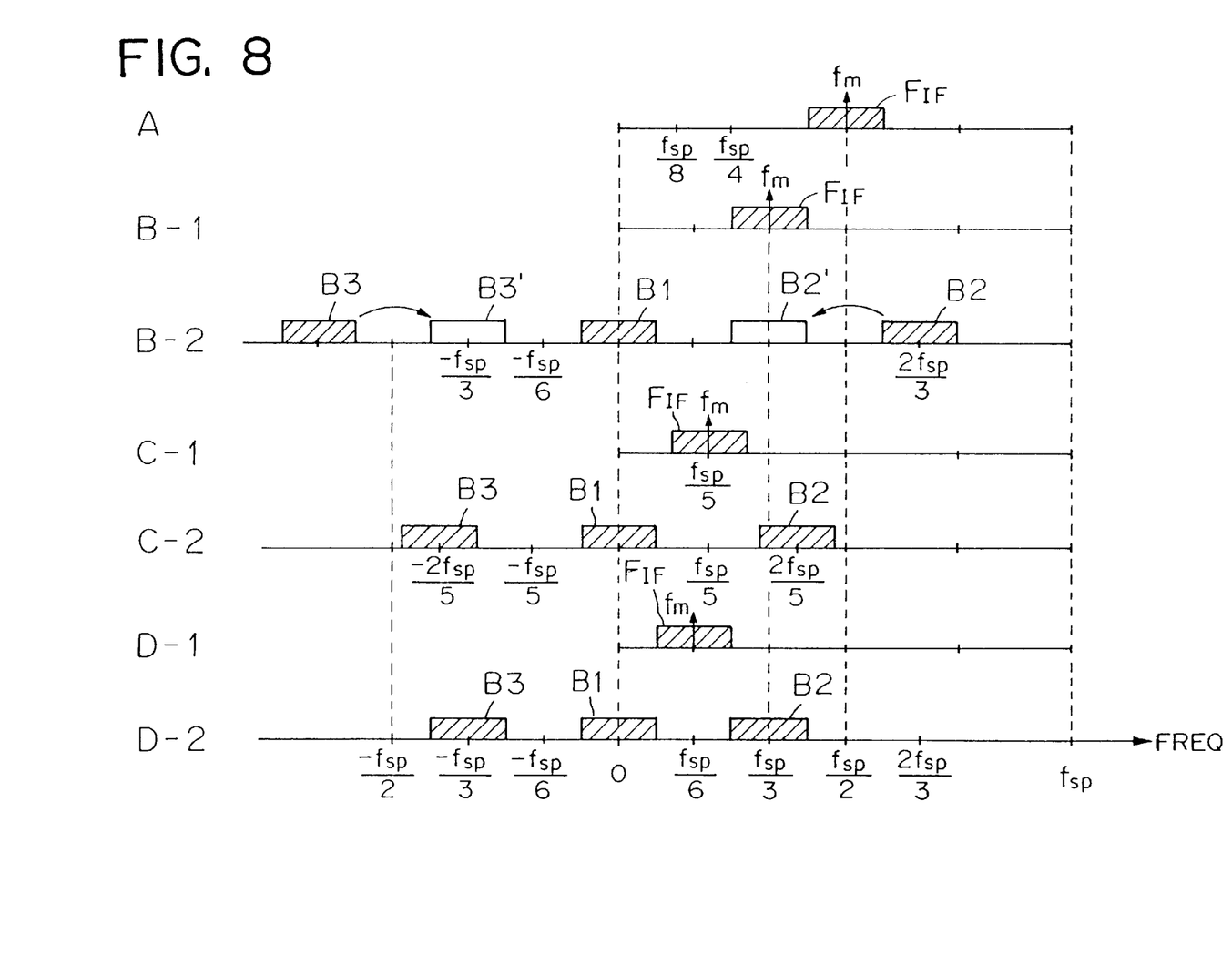
FIG. 8 shows examples of input and internal frequency bands of the quadrature detection part 19 when relations of $f_{sp}=2f_m$, $3f_m$, $5f_m$ and $6f_m$ are given between a sampling frequency $f_{sp}$ and a central frequency $f_m$ of an FM input signal V(t) in FIG. 2.

(A) Case of $f_{sp}=2f_m$

It is necessary to set a sampling frequency to higher than double of the maximum frequency of an input signal V(t) in accordance with the sampling theorem. In the case of $f_{sp}=2f_m$, since components exceeding Nyquist frequency $f_N=f_{sp}/2$ are contained in the frequency band (intermediate frequency band) $F_{IF}$ of the input signal V(t) as shown in row A of FIG. 8, $f_{sp}$ must be set as $f_{sp}>2f_m$.

(B) Case of $f_{sp}=3f_m$

As shown in row B-1 of FIG. 8, the frequency band $F_{IF}$ of the input signal V(t) is lower than the Nyquist frequency $f_N$. $I_b$ and $Q_b$ of formulas (1) and (2) obtained through the signal process of the quadrature detection part 19 contain a frequency band B1 of the difference frequency $(F_{IF}-f_m)$, a frequency band B2 of the summed frequency $(F_{IF}+f_m)$ and a frequency band B3 of $-(F_{IF+fm})$ (row B-2 of FIG. 8). Since B2 and B3 exceed the positive and negative Nyquist frequencies $f_N$ and $-f_N$ respectively, the discrete data of $I_b$ and $Q_b$ are folded at $f_N$ and $-f_N$ to generate aliasing components B2' and B3' respectively. The central frequencies of the aliasing components B2' and B3' are $\pm f_{sp}/3$ respectively. In the cases of FIG. 4A, 4B and 4C where $f_{sp}=4f_m$ is set, the central frequencies of the frequency bands B2 and B3 of $\pm(F_{IF}+f_m)$ are $\pm f_{sp}/2$ and thus, the frequency separation interval between B1 and B2 or B3 is larger than the case (B). Therefore, the filtering process for separating B1 and B2' or B3' requires a higher order filtering process i.e., acomplex process according to the decreased frequency separation interval compared with the filtering processes of FIG. 4A, 4B and 4C where $f_{sp}=4f_m$ is set.

(C) Case of $f_{sp}=5f_m$

The intermediate frequency band $F_{IF}$ shown in row C-1 of FIG. 8 is the frequency band B2 of summed frequency of which central frequency is $2f_{sp}/5$ as in row C-2 of FIG. 8. In this case the separation interval between Bi and B2 is smaller than the cases of FIGS. 4A, 4B and 4C where $f_{sp}=4f_m$ is set and thus the filtering process for the separation is more complex.

(D) Case of $f_{sp}=6f_m$

The intermediate frequency band $F_{IF}$ shown in row D-1 of FIG. 8 is the frequency band B2 of summed frequency of which central frequency is $f_{sp}/3$ as in row D-2 of FIG. 8. In this case, B2 matches the central frequency of the aliasing component B2' in (B).

Therefore, the filtering process for separating the difference frequency band B1 from the summed frequency band B2 is complex.

As mentioned above, in the cases of FIGS. 4A, 4B and 4C where $f_{sp}=4f_m$ is set, the separation interval between the difference frequency band B1 and the summed frequency band B2 is larger than the other cases. Therefore, the filtering process for separating these two frequency bands is easy. In addition, the width of the frequency band B1 of the signal V(t) can be made wider. Conversely, a lower sampling frequency $f_{sp}$ can be selected, and thus various digital processes become easy.

Incidentally, the aforementioned digital signal processing after the A/D converter 17 can be implemented by applying a DSP (digital signal processor).

As explained above, a conventional analog type FM frequency deviation measuring apparatus performs an FM demodulation by an analog circuit comprised of L, C, R and semi-conductor parts. Therefore, there is a shortcoming that the measured value of frequency deviation varies in accordance with the thermal and time passage change characteristics of these parts. However, since the FM frequency deviation measuring apparatus of the present invention makes an A/D conversion and a digital processing (i.e. computation process) to obtain a frequency deviation, the apparatus is not influenced by the characteristics changes of the parts and can significantly improve the thermal and time passage change characteristics.

Since the FM frequency deviation measuring apparatus of the present invention is a digital system, the apparatus can be arranged in LSI circuit, and thus the apparatus provides meritorious advantages of compact size and light weight.

We claim:

1. An FM frequency deviation measuring apparatus comprising:

A/D conversion means for converting an FM input signal to a digital signal;

quadrature detection means for calculating an in-phase component I and a quadrature component Q of the FM input signal from said digital signal;

means for obtaining differentials of time t, dI/dt and dQ/dt of said in-phase component I and said quadrature component Q to calculate an instantaneous frequency of the modulated signal $f_a(t)$ by a formula of $$f_a(t)=(IdQ/dt-QdI/dt)/\{2\pi(I^2+Q^2)\};$$

and deviation calculation means for obtaining frequency deviation width from said instantaneous frequency of the modulated signal $f_a(t)$ to calculate the maximum frequency deviation.

2. The measuring apparatus according to claim 1, wherein said frequency deviation calculation means is means for obtaining a positive peak value and a negative peak value of said instantaneous frequency of the modulated signal $f_a(t)$ to calculate an average value of those values as said frequency deviation.

3. The measuring apparatus according to claim 1, wherein said deviation calculation means comprising:

IQ calculation means for calculating an in-phase component $I_F$ and a quadrature component $Q_F$ of said instantaneous frequency of the modulated signal $f_a(t)$;

envelope calculation means for calculating an envelope value $En(t)=(IF^2+Q_F^2)^{1/2}$ of said instantaneous frequency of the modulated signal from the in-phase component $I_F$ and the quadrature component $Q_F$ of said instantaneous frequency of the modulated signal; and means for obtaining the maximum frequency deviation from said envelope value.

4. The measuring apparatus according to claim 3, wherein said means for obtaining the maximum frequency deviation includes:

means for interpolating between time series data of said envelope value of said instantaneous frequency of the modulated signal to obtain the maximum value of said envelope as said frequency deviation.

5. The measuring apparatus according to claim 4, wherein said IQ calculation means is means for quadrature-detecting said instantaneous frequency of the modulated signal $f_a(t)$ by a reference signal of ¼ frequency of a sampling frequency $f_{sp}$ of said A/D conversion means.

6. The measuring apparatus according to claim 3, wherein said IQ calculation means is means for quadrature-detecting said instantaneous frequency of the modulated signal $f_a(t)$ by a reference signal of ¼ frequency of the sampling frequency $f_{sp}$ of said A/D conversion means.

7. The measuring apparatus according to claim 1 wherein means for de-emphasizing the instantaneous frequency of the modulated signal of said FM input signal is provided between said differential calculation means or a modulation frequency calculation means and said frequency deviation calculation means.

8. The measuring apparatus according to claim 1, wherein filtering means for suppressing low frequency and high frequency noises included in the instantaneous frequency of the modulated signal of said FM input signal is provided between said differential calculation means or a modulation frequency calculation means and said frequency deviation calculation means.

9. The measuring apparatus according to claim 1, wherein when the central frequency of said FM input signal is $f_m$, the sampling frequency $f_{sp}$ of said A/D conversion means is selected to be $4 \times f_m$.

10. A method for measuring a frequency deviation of an FM input signal comprising steps of:

(a) converting said FM input signal to a digital signal;

(b) calculating an in-phase component I and a quadrature component Q of said FM input signal by quadrature detection from said digital signal;

(c) obtaining differentials of time t, dI/dt and dQ/dt of said in-phase component I and said quadrature component Q to calculate an instantaneous frequency of the modulated signal $f_a(t)$ by a formula of $$f_a(t)=(IdQ/dt-QdI/dt)/\{2\pi(I^2+Q^2)\};$$

and (d) obtaining frequency deviation width from said instantaneous frequency of the modulated signal $f_a(t)$ to calculate the maximum frequency deviation.

11. The method according to claim 10 wherein the step (d) of obtaining said frequency deviation is a step of obtaining a positive peak value and a negative peak value of said instantaneous frequency of the modulated signal $f_a(t)$ to calculate an average value of those values as said frequency deviation.

12. The method according to claim 10 wherein said step (d) further comprising steps of:

calculating an in-phase component $I_F$ and a quadrature component $Q_F$ of said instantaneous frequency of the modulated signal $f_a(t)$;

calculating an envelope value $En(t)=(I_F^2+Q_F^2)^{1/2}$ of said instantaneous frequency of the modulated signal $f_a(t)$ from the in-phase component $I_F$ and the quadrature component $Q_F$ of said instantaneous frequency of the modulated signal; and obtaining the maximum frequency deviation from said envelope value.

13. The method according to claim 12 wherein said step (d) further comprising a step of:

interpolating between time series data of said envelope value of said instantaneous frequency of the modulated signal to obtain the maximum value of said envelope as said frequency deviation.

14. The method according to claim 13, wherein the step for calculating said in-phase component $I_F$ and said quadrature component $Q_F$ further comprises a step of quadrature detecting said instantaneous frequency of the modulated signal $f_a(t)$ by a reference signal of ¼ frequency of a sampling frequency $f_{sp}$ of said A/D conversion.

15. The method according to claim 12 wherein the step for calculating said in-phase component $I_f$ and said quadrature component $Q_F$ includes a step of quadrature detecting said instantaneous frequency of the modulated signal $f_a(t)$ by a reference signal of ¼ frequency of the sampling frequency $f_{sp}$ of said A/D conversion.

16. The method according to claim 10 wherein said step (d) includes a step of de-emphasizing the instantaneous frequency of the modulated signal of said FM input signal.

17. The method according to claim 10 wherein said step (d) includes a filtering process step of suppressing low frequency and high frequency noises included in the instantaneous frequency of the modulated signal of said FM input signal.

18. The method according to claim 10 wherein when the central frequency of said FM input signal is $f_m$, the sampling frequency $f_{sp}$ of said A/D conversion is selected to be $4 \times f_m$.

19. An FM frequency deviation measuring apparatus comprising:

A/D conversion means for converting an FM input signal to a digital signal;

quadrature detection means for calculating an in-phase component I and a quadrature component Q of the FM input signal from said digital signal;

phase calculation means for calculating an instantaneous phase $\theta(t)=\tan^{-1}(Q/I)$ of said FM input signal from said in-phase component I and said quadrature component Q;

differential calculation means for calculating an instantaneous frequency of the modulated signal $f_a(t)$ of said FM input signal by differentiating time series data of said instantaneous phase $\theta(t)$; and deviation calculation means for obtaining frequency deviation width from said instantaneous frequency of the modulated signal to calculate a maximum frequency deviation, said deviation calculation means comprising:

IQ calculation means for calculating an in-phase component $I_F$ and a quadrature component $Q_F$ of said instantaneous frequency of the modulated signal $f_a(t)$, envelope calculation means for calculating an envelope value $En(t)=(I_F^2+Q_F^2)^{1/2}$ of said instantaneous frequency of the modulated signal from the in-phase component $I_F$ and the quadrature component $Q_F$ of said instantaneous frequency of the modulated signal, and means for obtaining the maximum frequency deviation from said envelope value.

20. The measuring apparatus according to claim 19, wherein said means for obtaining the maximum frequency deviation comprises:

means for interpolating between time series data of said envelope value of said instantaneous frequency of the modulated signal to obtain the maximum value of said envelope as said frequency deviation.

21. The measuring apparatus according to claim 20, wherein said IQ calculation means is means for quadrature-detecting said instantaneous frequency of the modulated signal $f_a(t)$ by a reference signal of ¼ frequency of a sampling frequency $f_{sp}$ of said A/D conversion means.

22. The measuring apparatus according to claim 19, wherein said IQ calculation means is means for quadrature-detecting said instantaneous frequency of the modulated signal $f_a(t)$ by a reference signal of ¼ frequency of a sampling frequency $f_{sp}$ of said A/D conversion means.

23. An FM frequency deviation measuring apparatus comprising:

A/D conversion means for converting an FM input signal to a digital signal;

quadrature detection means for calculating an in-phase component I and a quadrature component Q of the FM input signal from said digital signal;

phase calculation means for calculating an instantaneous phase $\theta(t)=\tan^{-1}(Q/I)$ of said FM input signal from said in-phase component I and said quadrature component Q;

differential calculation means for calculating an instantaneous frequency of the modulated signal $f_a(t)$ of said FM input signal by differentiating time series data of said instantaneous phase $\theta(t)$;

deviation calculation means for obtaining frequency deviation width from said instantaneous frequency of the modulated signal to calculate a maximum frequency deviation; and means for de-emphasizing the instantaneous frequency of the modulated signal of said FM input signal provided between said differential calculation means or a modulation frequency calculation means and said deviation calculation means.

24. A method for measuring a frequency deviation of an FM input signal comprising steps of:

(a) converting said FM input signal to a digital signal;

(b) calculating an in-phase component I and a quadrature component Q of said FM input signal by quadrature detection from said digital signal;

(c) calculating an instantaneous phase $\theta(t)=\tan^{-1}(Q/I)$ of said FM input signal from said in-phase component I and said quadrature component Q;

(d) differentiating time series data of said instantaneous phase $\theta(t)$ to calculate an instantaneous frequency of the modulated signal $f_a(t)$ of said FM input signal; and (e) obtaining a frequency deviation width from said instantaneous frequency of the modulated signal to calculate a maximum frequency deviation, said step (d) further comprising steps of:

calculating an in-phase component $I_F$ and a quadrature component $Q_F$ of said instantaneous frequency of the modulated signal $f_a(t)$;

calculating an envelope value $En(t)=(I_f^2+Q_F^2)^{1/2}$ of said instantaneous frequency of the modulated signal $f_a(t)$ from the in-phase component $I_F$ and the quadrature component $Q_F$ of said instantaneous frequency of the modulated signal, and obtaining the maximum frequency deviation from said envelope value.

25. The method according to claim 24 wherein said step (d) further comprises the step of interpolating between time series data of said envelope value of said instantaneous frequency of the modulated signal to obtain a maximum value of said envelope as said frequency deviation.

26. The method according to claim 25, wherein the step for calculating said in-phase component $I_F$ and said quadrature component $Q_F$ further comprises a step of quadrature detecting said instantaneous frequency of the modulated signal $f_a(t)$ by a reference signal of ¼ frequency of a sampling frequency $f_{sp}$ of said A/D conversion.

27. The method according to claim 24, wherein the step for calculating said in-phase component $I_F$ and said quadrature component $Q_F$ further comprises a step of quadrature detecting said instantaneous frequency of the modulated signal $f_a(t)$ by a reference signal of ¼ frequency of a sampling frequency $f_{sp}$ of said A/D conversion.

28. A method for measuring a frequency deviation of an FM input signal comprising steps of:

(a) converting said FM input signal to a digital signal;

(b) calculating an, in-phase component I and a quadrature component Q of said FM input signal by quadrature detection from said digital signal;

(c) calculating an instantaneous phase $\theta(t)=\tan^{-1}(Q/I)$ of said FM input signal from said in-phase component I and said quadrature component;

(d) differentiating time series data of said instantaneous phase $\theta(t)$ to calculate an instantaneous frequency of the modulated signal $f_a(t)$ of said FM input signal, said step (d) comprising the step of de-emphasizing the instantaneous frequency of the modulated signal of said FM input signal; and (e) obtaining a frequency deviation width from said instantaneous frequency of the modulated signal to calculate a maximum frequency deviation.

29. An FM frequency deviation measuring apparatus comprising:

A/D conversion means for converting an FM input signal to a digital signal;

quadrature detection means for calculating an in-phase component I and a quadrature component Q of the FM input signal from said digital signal;

modulation frequency calculation means for calculating an instantaneous frequency of the modulated signal $f_a(t)$ of said FM input signal from a Hilbert transformation of the in-phase component I and the quadrature component Q;

deviation calculation means for obtaining frequency deviation width from said instantaneous frequency of the modulated signal to calculate a maximum frequency deviation; and means for de-emphasizing the instantaneous frequency of the modulated signal of said FM input signal provided between said modulation frequency calculation means and said deviation calculation means.

30. An FM frequency deviation measuring apparatus comprising:

A/D conversion means for converting an FM input signal to a digital signal;

quadrature detection means for calculating an in-phase component I and a quadrature component Q of the FM input signal from said digital signal;

phase calculation means for calculating an instantaneous phase $\theta(t)=\tan^{-1}(Q/I)$ of said FM input signal from said in-phase component I and said quadrature component Q;

differential calculation means for calculating an instantaneous frequency of the modulated signal $f_a(t)$ of said FM input signal by differentiating time series data of said instantaneous phase $\theta(t)$;

deviation calculation means for obtaining frequency deviation width from said instantaneous frequency of the modulated signal to calculate a maximum frequency deviation; and means for de-emphasizing the instantaneous frequency of the modulated signal of said FM input signal provided between said differential calculation means and said deviation calculation means.

* * * * *

UNITED STATES PATENT AND TRADEMARK OFFICE
CERTIFICATE OF CORRECTION

PATENT NO. : 5,771,443

DATED : June 23, 1998

INVENTOR(S) : Nagano et al.

It is certified that error appears in the above-identified patent and that said Letters Patent is hereby corrected as shown below:

Title page, item [75], "Saitama" should be --Kitaadachi--;

item [57] ABSTRACT, line 5, "d0/dt" should be --d$\theta$/dt--.

Col. 3, line 12 "$f_s\pm$" should be --$f_{sp}\pm$--;

line 62, "O(t)" should be --$\theta$(t)--.

Col. 4, equation (8), "$\theta(t)=\tan^1 Z$" should be --$\theta(t)=\tan^{-1} Z$--.

Col. 6, equation (17), "$=_i \cos$" should be --$=x_i \cos$--.

Col. 12, line 42, "$I_f^2$" should be --$I_F^2$--.

Col. 13, line 2, delete ",".

Signed and Sealed this

Nineteenth Day of January, 1999

Attest:

Attesting Officer

*Acting Commissioner of Patents and Trademarks*